US010644140B2

(12) United States Patent
Le et al.

(10) Patent No.: US 10,644,140 B2
(45) Date of Patent: May 5, 2020

(54) INTEGRATED CIRCUIT DIE HAVING BACK-END-OF-LINE TRANSISTORS

(71) Applicant: Intel Corporation, Santa Clara, CA (US)

(72) Inventors: Van Hoang Le, Portland, OR (US); Gilbert William Dewey, Beaverton, OR (US); Marko Radosavljevic, Portland, OR (US); Rafael Rios, Austin, TX (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/095,655

(22) PCT Filed: Jun. 30, 2016

(86) PCT No.: PCT/US2016/040558
§ 371 (c)(1),
(2) Date: Oct. 22, 2018

(87) PCT Pub. No.: WO2018/004629
PCT Pub. Date: Jan. 4, 2018

(65) Prior Publication Data
US 2019/0131437 A1    May 2, 2019

(51) Int. Cl.
*H01L 29/66*    (2006.01)
*H01L 29/417*   (2006.01)
(Continued)

(52) U.S. Cl.
CPC .... *H01L 29/66969* (2013.01); *H01L 27/1211* (2013.01); *H01L 29/0673* (2013.01);
(Continued)

(58) Field of Classification Search
CPC ............. H01L 27/1211; H01L 29/0673; H01L 29/247; H01L 29/41775; H01L 29/42392;
(Continued)

(56) References Cited

U.S. PATENT DOCUMENTS

2012/0306018 A1    12/2012  Gates et al.
2014/0097434 A1    4/2014   Ellis-Monaghan et al.
(Continued)

OTHER PUBLICATIONS

International Search Report and Written Opinion for International Patent Application No. PCT/US2016/040558 dated Mar. 30, 2017, 13 pgs.
(Continued)

*Primary Examiner* — Allan R Wilson
(74) *Attorney, Agent, or Firm* — Schwabe, Williamson & Wyatt, P.C.

(57) ABSTRACT

Integrated circuit dies having multi-gate, non-planar transistors built into a back-end-of-line portion of the die are described. In an example, non-planar transistors include an amorphous oxide semiconductor (AOS) channel extending between a source module and a drain module. A gate module may extend around the AOS channel to control electrical current flow between the source module and the drain module. The AOS channel may include an AOS layer having indium gallium zinc oxide.

17 Claims, 12 Drawing Sheets

(51) Int. Cl.
  *H01L 29/423*  (2006.01)
  *H01L 29/786*  (2006.01)
  *H01L 27/12*   (2006.01)
  *H01L 29/06*   (2006.01)
  *H01L 29/24*   (2006.01)
  *H01L 29/78*   (2006.01)
  *H01L 29/812*  (2006.01)
  *H01L 29/778*  (2006.01)

(52) U.S. Cl.
  CPC ...... *H01L 29/247* (2013.01); *H01L 29/41775* (2013.01); *H01L 29/42392* (2013.01); *H01L 29/7853* (2013.01); *H01L 29/78693* (2013.01); *H01L 29/78696* (2013.01); *H01L 29/778* (2013.01); *H01L 29/8126* (2013.01); *H01L 2224/73204* (2013.01); *H01L 2924/15311* (2013.01); *H01L 2924/181* (2013.01)

(58) Field of Classification Search
  CPC ......... H01L 29/66969; H01L 29/78693; H01L 29/78696
  See application file for complete search history.

(56) References Cited

U.S. PATENT DOCUMENTS

| | | |
|---|---|---|
| 2014/0367857 A1 | 12/2014 | Yang et al. |
| 2015/0162448 A1 | 6/2015 | Raghavan et al. |
| 2015/0263088 A1 | 9/2015 | Cheng et al. |
| 2015/0280013 A1* | 10/2015 | Yamazaki .......... H01L 29/78693 257/43 |
| 2015/0372009 A1* | 12/2015 | Yamazaki ........... H01L 27/1203 257/43 |
| 2016/0043085 A1* | 2/2016 | Ching .................. H01L 27/092 257/347 |
| 2016/0233340 A1* | 8/2016 | Shimomura ...... H01L 29/78696 |
| 2017/0062619 A1* | 3/2017 | Sasagawa .......... H01L 29/7869 |
| 2017/0207347 A1* | 7/2017 | Endo .................. H01L 27/1225 |

OTHER PUBLICATIONS

International Preliminary Report on Patentability for International Patent Application No. PCT/US2016/040558 dated Jan. 10, 2019, 10 pgs.

\* cited by examiner

DETAIL A

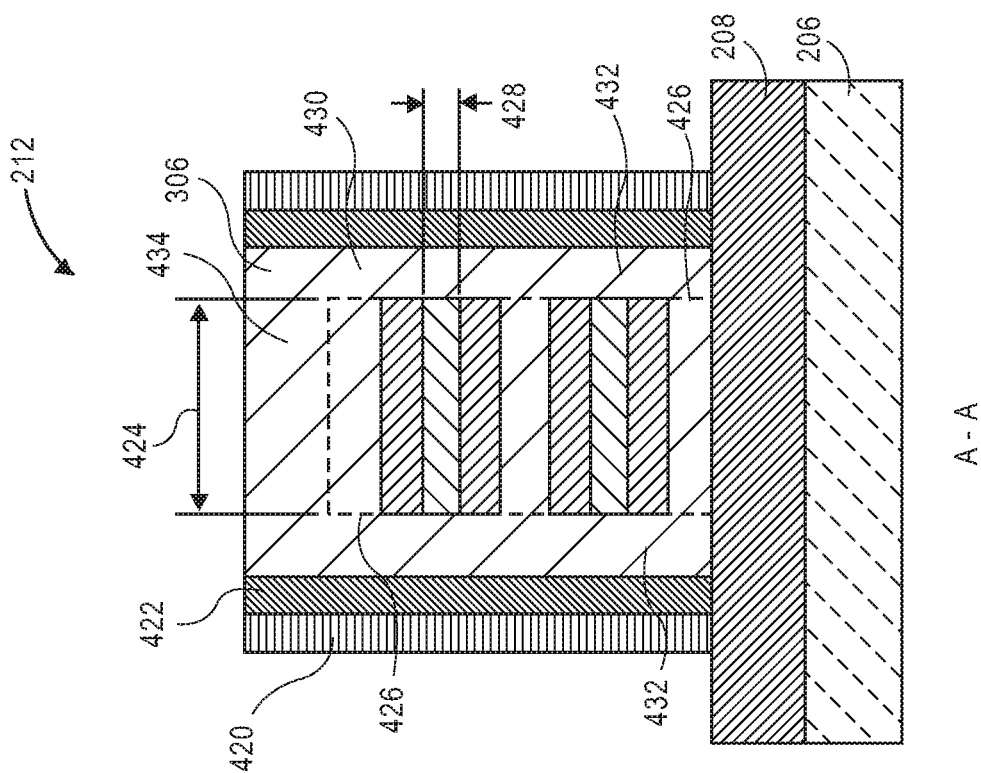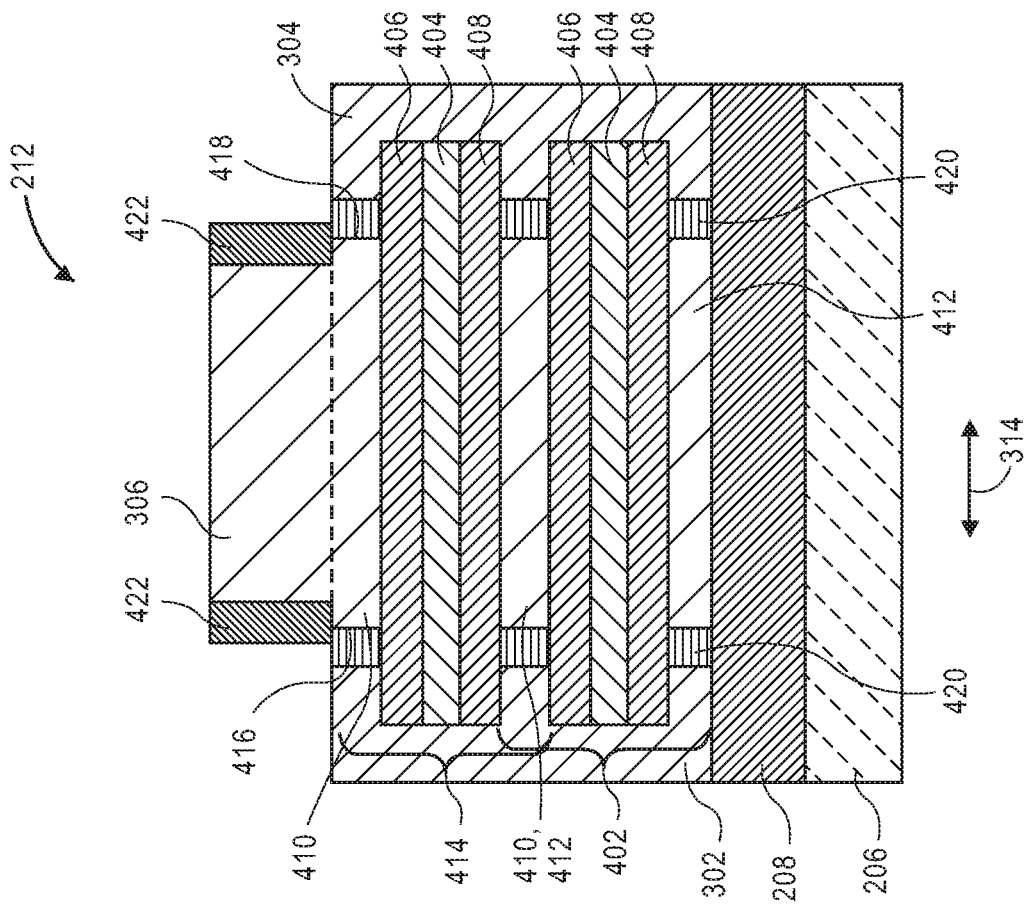

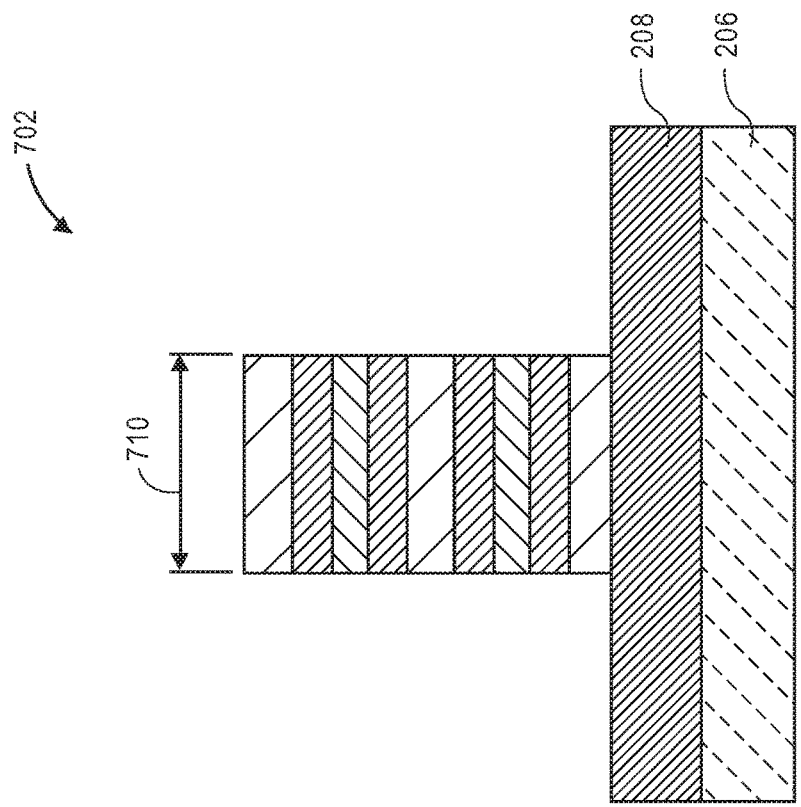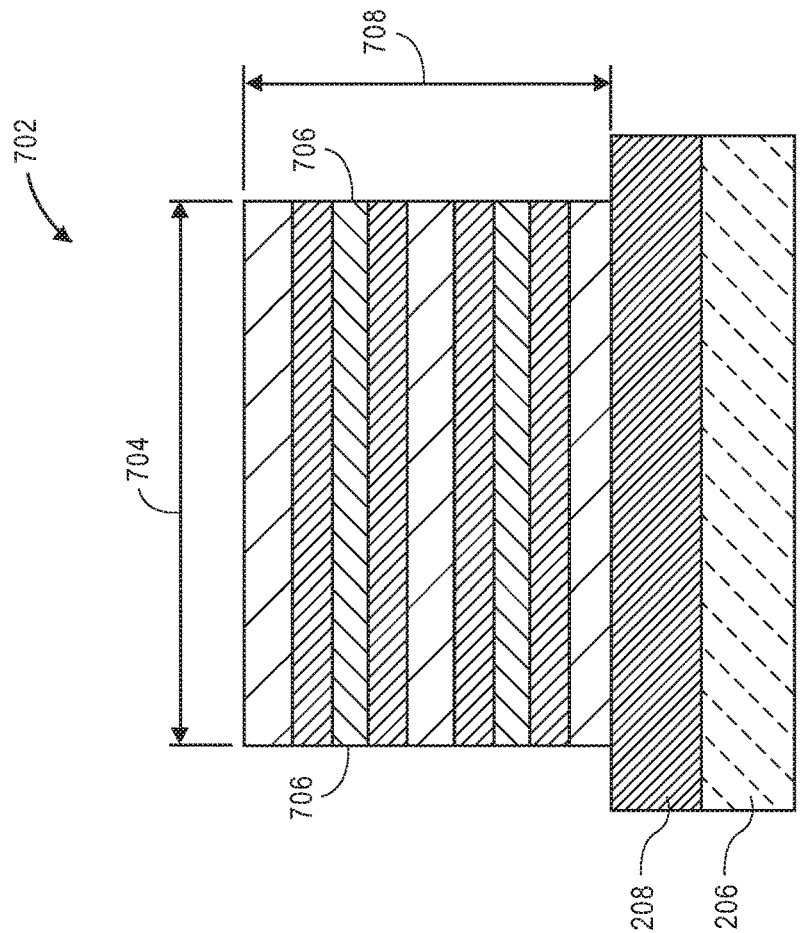
Figure 7A
Figure 7B

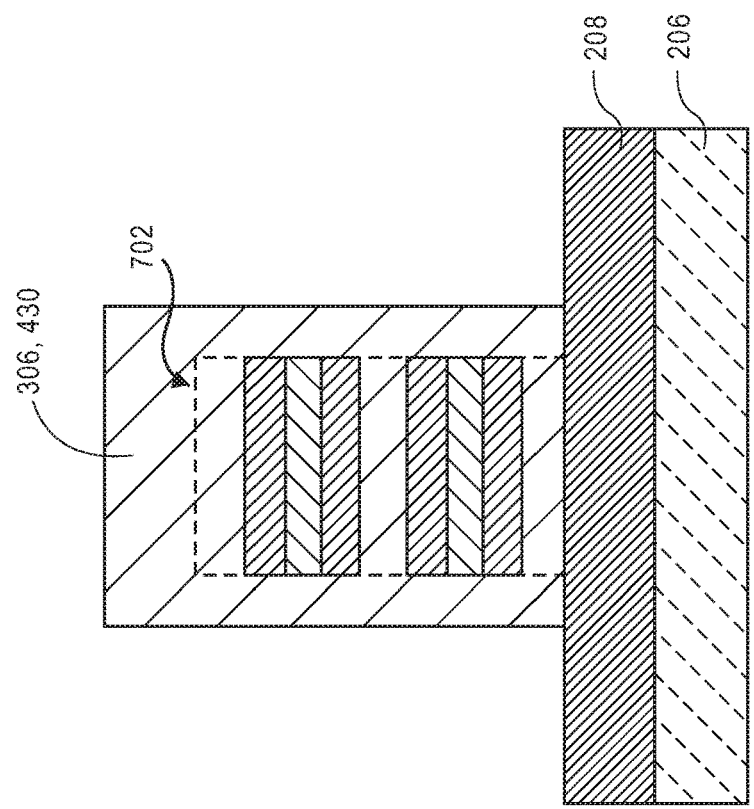
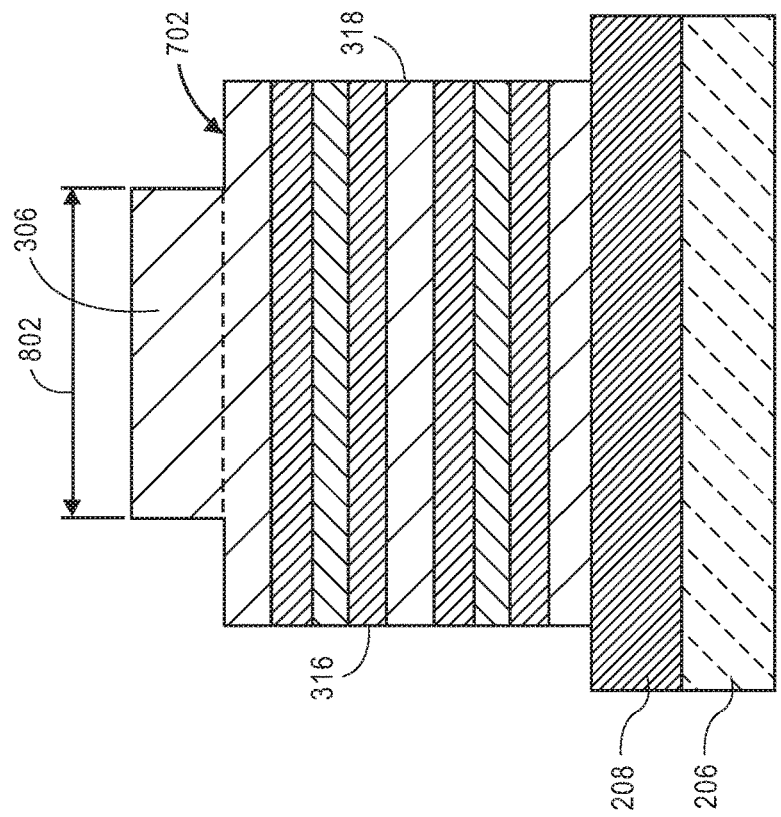
Figure 8A
Figure 8B

INTEGRATED CIRCUIT DIE HAVING BACK-END-OF-LINE TRANSISTORS

CROSS-REFERENCE TO RELATED APPLICATION

This patent application is a U.S. National Phase Application under 35 U.S.C. § 371 of International Application No. PCT/US2016/040558, filed Jun. 30, 2016, entitled "INTEGRATED CIRCUIT DIE HAVING BACK-END-OF-LINE TRANSISTORS," which designates the United States of America, the entire disclosure of which is hereby incorporated by reference in its entirety and for all purposes.

TECHNICAL FIELD

Embodiments are in the field of integrated circuits and, in particular, integrated circuit dies having multi-gate, non-planar transistors.

BACKGROUND

Integrated circuit development in the semiconductor industry is guided by the precept that the number of transistors per unit area of a die will increase generation after generation. Today, the number of transistors per die is typically on the order of billions. This staggering number has been achieved by scaling down the physical dimensions of transistors to allow more transistors to be fit per unit area of the die. By increasing the number of transistors, more elaborate circuits may be made to increase the functionality of microprocessors.

Currently, transistors are fabricated during front-end-of-line (FEOL) manufacturing processes. More particularly, the transistor structure is fashioned onto the semiconductor material of the die itself, i.e., in an FEOL portion of the die. For example, a gate, source, and drain of each transistor is built along a planar surface of the semiconductor material of the die. The die also includes a back-end-of-line (BEOL) portion having interconnects between the FEOL transistors and an external interface of the die, such as a bonding pad.

The FEOL portion and the BEOL portion of the die may be distinguished from each other in several ways. First, the FEOL portion may be fabricated in an FEOL manufacturing process having a higher thermal budget than a BEOL manufacturing process used to fabricate the BEOL portion. For example, the FEOL manufacturing process may have a thermal budget on an order of thousands of degrees Celsius, e.g., 1000° C., and the BEOL manufacturing process may have a thermal budget on an order of hundreds of degrees Celsius, e.g., 400° C. Second, the FEOL portion typically includes active components, e.g., transistors, and the BEOL portion typically includes passive components, e.g., electrical interconnects and vias.

BRIEF DESCRIPTION OF THE DRAWINGS

FIGS. 4A-4B illustrate sectional views of a non-planar transistor in a back-end-of-line portion of an integrated circuit die, in accordance with an embodiment.

FIGS. 6-11B illustrate operations of a method of fabricating a non-planar transistor in a back-end-of-line portion of an integrated circuit die, in accordance with an embodiment.

DESCRIPTION OF EMBODIMENTS

Integrated circuit dies having multi-gate, non-planar transistors built into a back-end-of-line portion of the die, and integrated circuit packages including such integrated circuit dies, are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Existing integrated circuit dies only incorporate planar transistors within a front-end-of-line (FEOL) portion of the die. For example, the planar transistors are built along a face of a semiconductor layer of the integrated circuit dies. The integrated circuit dies, however, do not incorporate transistors into a back-end-of-line (BEOL) portion of the die. The BEOL portion has not incorporated transistors because the high thermal budget required to form planar transistors may destroy the other BEOL components. Accordingly, a number of transistors within the die is limited by an ability to scale down the planar transistors and a size of the FEOL portion. On the other hand, a viable solution to incorporating transistors into the BEOL portion of the die can contribute to achieving the goal of ever-increasing transistor density in the semiconductor industry.

In an aspect, multi-gate, non-planar transistors are fabricated by a BEOL process. The transistors may include an amorphous oxide semiconductor material, e.g., indium gallium zinc oxide (IGZO), which may be formed by the BEOL process. Similarly, a gate module, source module, and drain module, may be formed by the BEOL process. Accordingly, the multi-gate, non-planar transistors may be built into the BEOL portion of an integrated circuit die for use in a variety of functional applications such as memory, power delivery, etc. Furthermore, the multi-gate, non-planar transistors may provide improved electrostatics, e.g., lower off-current at a given drive voltage, as compared to planar transistors built into an FEOL portion of the integrated circuit die. Thus, the BEOL transistors described below provide three-dimensional integration that increases microprocessor functionality per unit area.

Figure 1:
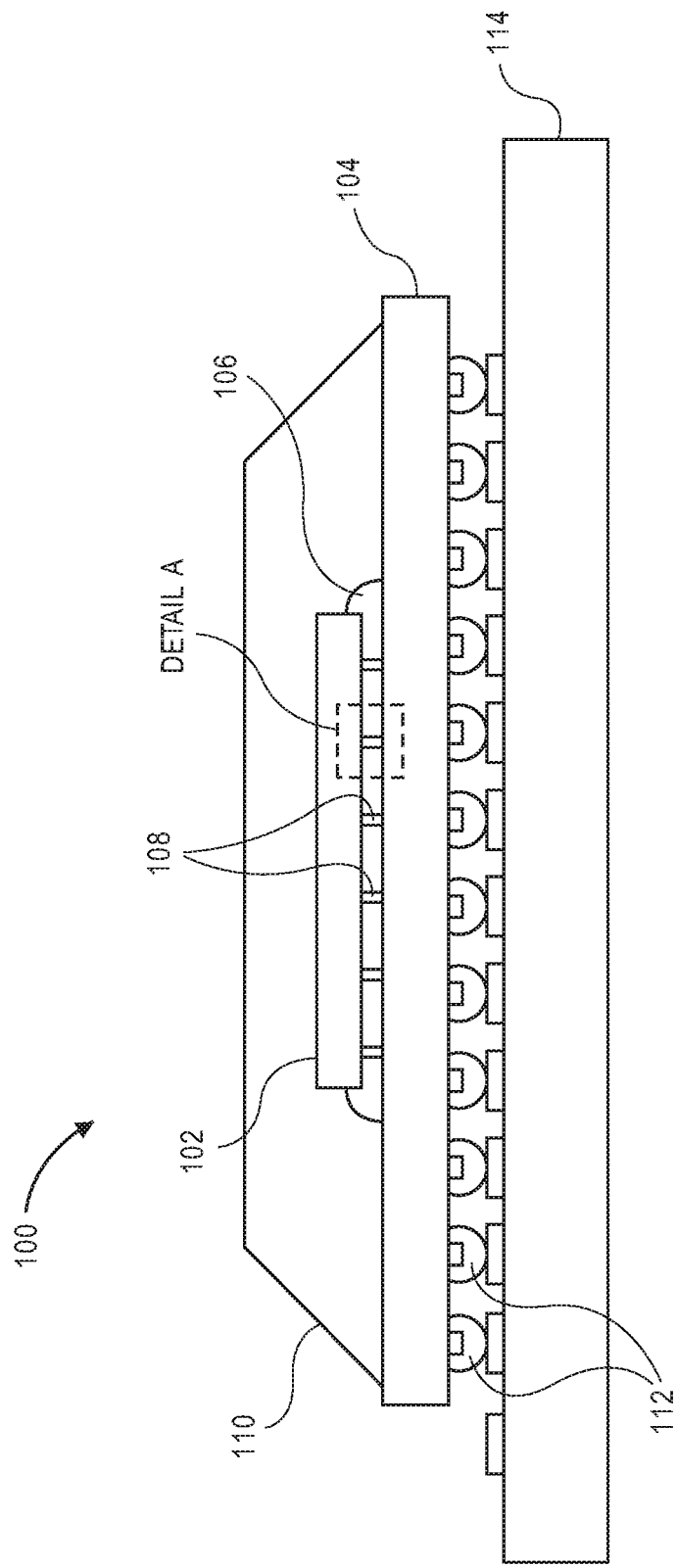
FIG. 1 illustrates a sectional view of an integrated circuit package, in accordance with an embodiment.

Referring to FIG. 1, a sectional view of an integrated circuit package is shown in accordance with an embodiment. An integrated circuit package 100 may include an integrated circuit die 102 mounted on a package substrate 104. For example, the integrated circuit die 102 may be positioned over the package substrate 104, and an underfill material 106 may couple the integrated circuit die 102 to the package substrate 104. The integrated circuit package 100 may include a wire-bonding package, or as shown, integrated circuit package 100 may include a non-wire bonding package, e.g., a flip chip package. For example, electrical connections between integrated circuit die 102 and package substrate 104 may be include solder bump connections 108 extending through underfill material 106.

Integrated circuit package 100 may include a top package portion 110, e.g., a plastic cap, over package substrate 104. Package substrate 104 of integrated circuit package 100 may have a laminate structure. For example, conductive layers, e.g., layers having copper pads and traces, may be separated by dielectric layers, e.g., layers having organic epoxy-based dielectric material. Package substrate 104 may be a ball grid array (BGA) component, and the conductive layers may be electrically connected to several solder balls 112, arranged in a ball field. More particularly, solder balls 112 may be arranged in a pattern on a bottom surface of package substrate 104. Accordingly, each solder ball 112 may be electrically connected to integrated circuit die 102 to provide an electrical function. For example, solder balls 112 may be electrically connected to solder bumps 108 used for I/O, power, or ground functions of integrated circuit die 102. Furthermore, solder balls 112 may be mounted and attached to a circuit board 114, e.g., a motherboard or another printed circuit board of a computer system, to provide a physical and electrical interface between integrated circuit die 102 and circuit board 114.

Figure 2:
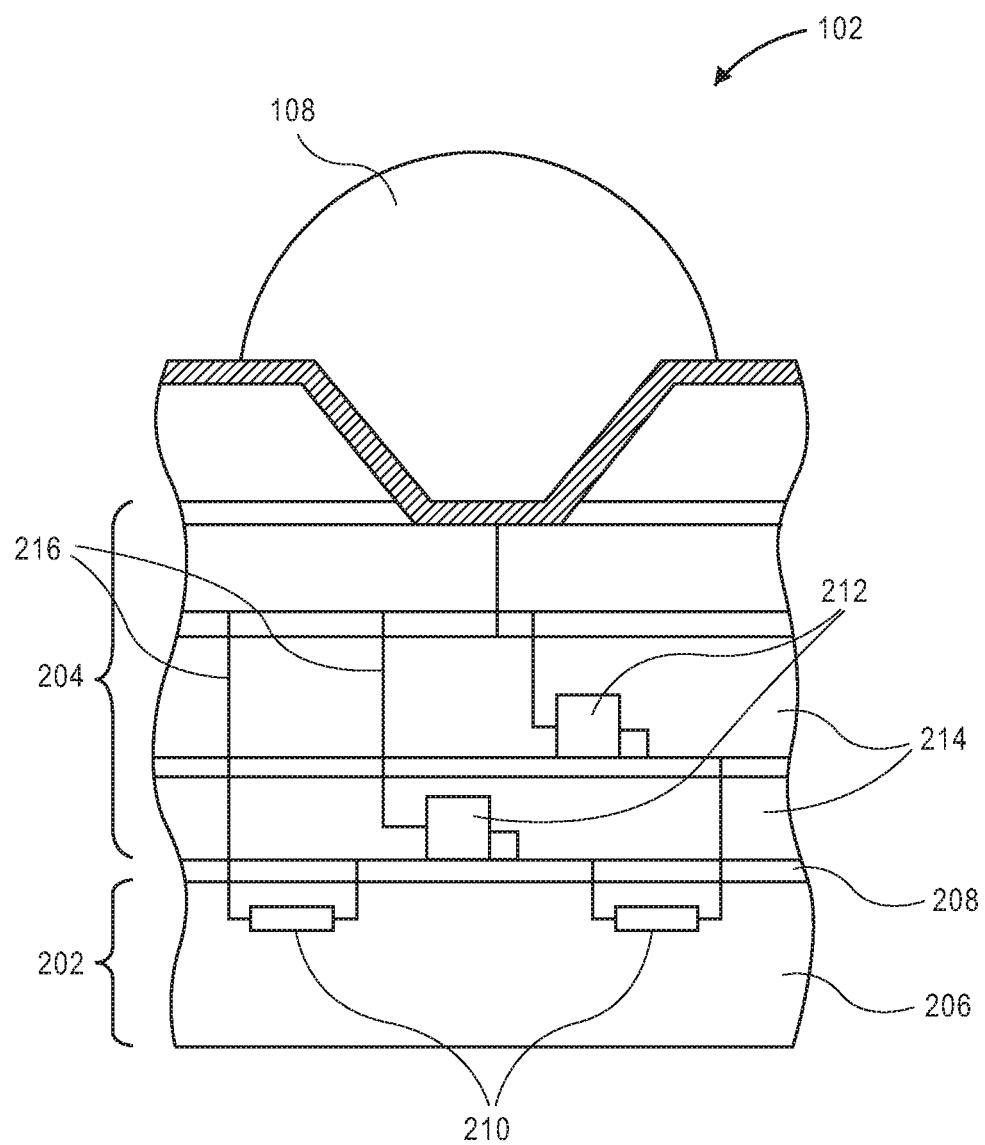
FIG. 2 illustrates a detail view, taken from Detail A of FIG. 1, of a front-end-of-line portion and a back-end-of-line portion of an integrated circuit die, in accordance with an embodiment.

Referring to FIG. 2, a detail view, taken from Detail A of FIG. 1, of a front-end-of-line portion and a back-end-of-line portion of an integrated circuit die is shown in accordance with an embodiment. Integrated circuit die 102 may include an FEOL portion 202 and a BEOL portion 204. BEOL portion 204 may be disposed on FEOL portion 202. For example, FEOL portion 202 may include a silicon layer 206, and an insulating layer 208 may be disposed over silicon layer 206. BEOL portion 204 may be mounted on insulating layer 208. For example, BEOL portion 204 may be formed on insulating layer 208 during a BEOL process.

FEOL portion 202 may include several front end transistors, e.g., planar transistors 210, formed along a surface of integrated circuit die 102. Accordingly, the planar transistors 210 may be coplanar with each other within a plane parallel to insulating layer 208. Planar transistors 210 may be three-terminal devices having a source and a drain between which electrical current flows, as is known in the art. Planar transistors 210 may be made from silicon during an FEOL process. The FEOL process may include the formation of a dielectric insulator over silicon layer 206. More particularly, insulating layer 208 having the dielectric insulator material may be laminated over silicon layer 206 during the FEOL process.

BEOL portion 204 may include several non-planar transistors 212. For example, BEOL portion 204 may include several dielectric layers 214, and one or more non-planar transistor 212 may be formed within each dielectric layer 214. For example, a respective dielectric layer 214 may laterally surround a respective non-planar transistor 212 such that non-planar transistors 212 are encapsulated within dielectric layers 214 of BEOL portion 204. BEOL portion 204 may be located between FEOL portion 202 and solder bump 108 of integrated circuit die 102. As such, non-planar transistors 212 of integrated circuit die 102 may be vertically offset from, e.g., above, planar transistors 210 of integrated circuit die 102. Furthermore, non-planar transistors 212 may be laterally adjacent to each other within a same dielectric layer 214, or vertically offset from each other within different dielectric layers 214.

Transistors of integrated circuit die 102, e.g., planar transistors 210 and non-planar transistors 212, may be interconnected with each other and with external interface features through one or more electrical interconnects 216. Electrical interconnects 216 may include traces, vias, or leads, extending along or through the layers of integrated circuit die 102. For example, planar transistors 210 and/or non-planar transistors 212 may be electrically connected to solder bump 108 through respective electrical paths having an electrical via and an electrical trace.

Figure 3:
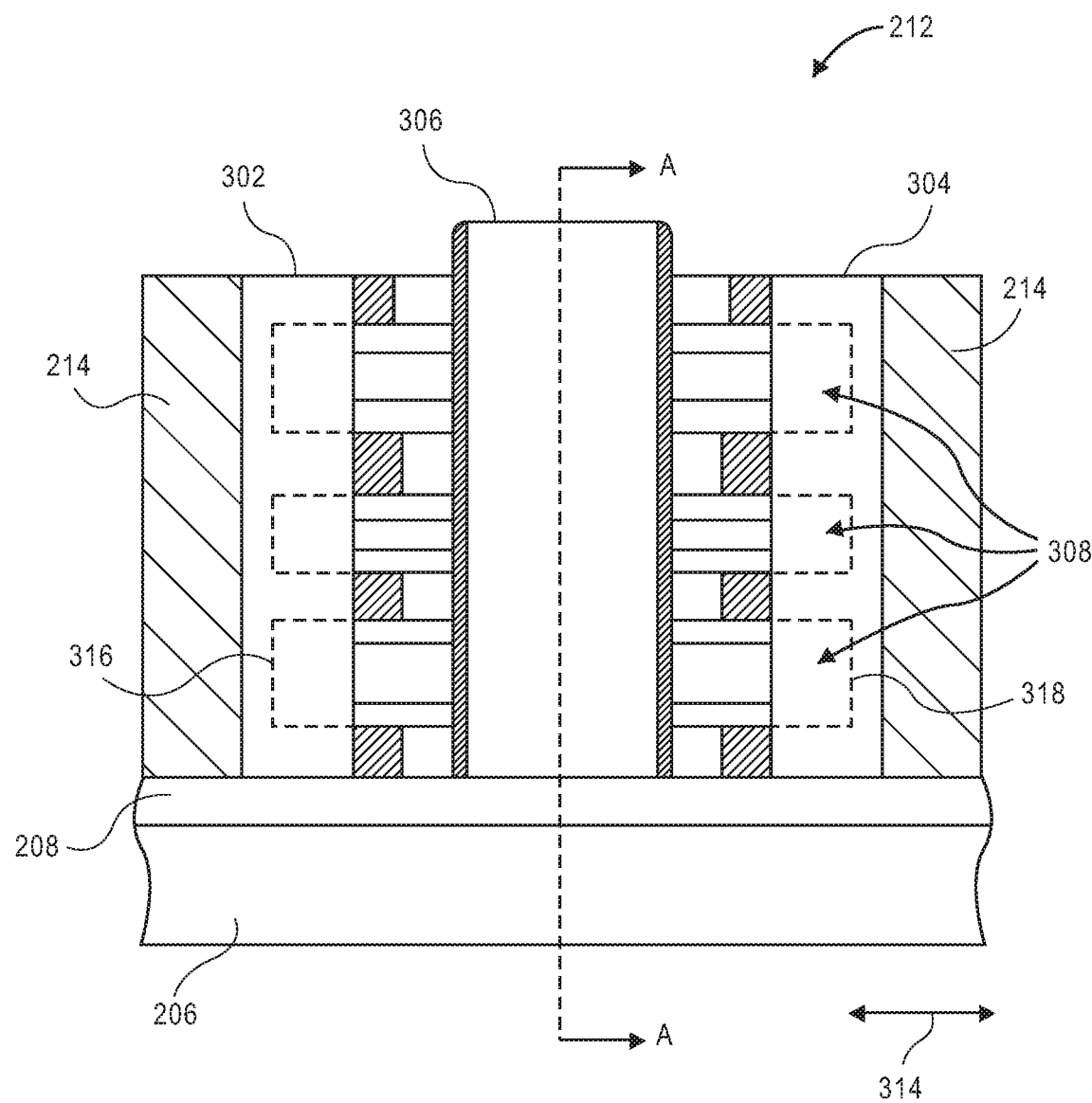
FIG. 3 illustrates a side view of a non-planar transistor in a back-end-of-line portion of an integrated circuit die, in accordance with an embodiment.

Referring to FIG. 3, a side view of a non-planar transistor in a back-end-of-line portion of an integrated circuit die is shown in accordance with an embodiment. Non-planar transistors 212 may include a three-terminal device having a three-dimensional structure. Terminals of non-planar transistor 212 may include a source module 302 and a drain module 304 between which electrical current may flow. A gate module 306 may be a third terminal located between source module 302 and drain module 304 to control, i.e., start and stop, the flow of electrical current between the source and drain of the device. Gate module 306 controls the flow of electrical current by applying a drive voltage to a gate material, and a value of the drive voltage determines whether electrical charge is repelled or drawn into the gate material, i.e., whether electrical current flows between source module 302 and drain module 304.

In an embodiment, electrical current flows between source module 302 and drain module 304 through one or more amorphous oxide semiconductor (AOS) channels 308. For example, non-planar transistor 212 may include a stack of AOS channels 308. The stack may be in a vertical direction perpendicular to an axial direction 314, and thus, may be considered to be three-dimensional, i.e., non-planar. Each AOS channel 308 in the stack may extend in axial direction 314 from a first end 316 at source module 302 to a second end 318 at drain module 304. Thus, electrical current may be carried axially through each AOS channel 308 from source module 302 to drain module 304.

Gate module 306 may apply a drive voltage to control the flow of electrical current through AOS channel(s) 308. As described below, non-planar transistors 212 may be multi-gate transistors, so-called because the three-dimensional structure of non-planar transistor 212 includes gate module 306 extending vertically upward and transversely around one or more AOS channels 308 to create multiple gate-to-channel interfaces. For example, the three-dimensional structure may include a fin structure having several sides in contact with gate module 306, and thus, gate module 306 may apply the drive voltage around the fin structure to choke the electrical current. More particularly, gate module 306 may contact lateral sides, i.e., lateral to axial direction 314, of AOS channel(s) 308 to maximize electrical contact. Accordingly, gate module 306 may apply the drive voltage to a larger surface area as compared to the surface area of a planar transistor 210 having a same footprint on silicon layer 206, and thus, an off-current, i.e., electrical current leakage, of non-planar transistor 212 may be less than that of planar transistor 210. A lower off-current results in better power performance of the non-planar transistor 210.

Referring to FIG. 4A, a sectional view of a non-planar transistor in a back-end-of-line portion of an integrated circuit die is shown in accordance with an embodiment. The cross-sectional view may be along a vertical plane extending in axial direction 314 through the non-planar transistor 212 illustrated in FIG. 3. More particularly, the cross-sectional view may be parallel to a face of the page illustrating FIG. 3, and through the center of non-planar transistor 212 in axial direction 314. The cross-sectional view may be referred to as a gate cut view.

Each AOS channel 308 of the stack of channels of non-planar transistor 212 may include several layers. For example, a first AOS channel 402, shown at the lowest position of the AOS channel 308 stack, may include an AOS layer 404 at a core or center of the channel The AOS layer 404 may include any AOS material, and in an embodiment, AOS layer 404 includes IGZO. AOS layer 404 may be sandwiched between an upper dielectric layer 406 and the lower dielectric layer 408. The sandwich structure of AOS layer 404 and dielectric layers 214 may provide an electrical conduit between source module 302 and drain module 304. For example, AOS channel 402 may extend laterally in axial direction 314 such that a first end terminates within source module 302 and a second end terminates within drain module 304.

The electrical conduits of the AOS channels 308, i.e., the sandwich structure of AOS layer 404 and dielectric layers 214, may be sandwiched between one or more metal gate. For example, upper dielectric layer 406 of first AOS channel 402 may be between an upper metal gate layer 410 and AOS layer 404. Similarly, a lower dielectric layer 408 of first AOS channel 402 may be between a lower metal gate layer 412 and AOS layer 404. The AOS channel stack may include a second AOS channel 414 above first AOS channel 402. Like first AOS channel 402, second AOS channel 414 may include respective upper dielectric layer 406 and lower dielectric layer 408. The respective upper dielectric layer 406 may be between a respective upper metal gate layer 410 and a respective AOS layer 404. The respective lower dielectric layer 408 may be between a respective lower metal gate layer 412 and the respective AOS layer 404.

The metal gate layers of non-planar transistor 212 may be in contact with the electrical conduit provided by AOS layer 404 and dielectric layers 214 to transfer the drive voltage from gate module 306 to the electrical conduit. In an embodiment, a contact area between the metal gate layers and the electrical conduit may be over an axial distance that is greater than an axial length of gate module 306, and less than an axial distance between source module 302 and drain module 304. More particularly, the metal gate layers may extend axially between a first axial edge 416 and a second axial edge 418, and the distance between first axial edge 416 and second axial edge 418 may be greater than the axial length of gate module 306. Thus, first axial edge 416 may be located axially between source module 302 and gate module 306, and second axial edge 418 may be located axially between gate module 306 and drain module 304.

The AOS channels 308 may accordingly be stacked vertically between an underlying FEOL portion 202 and gate module 306. For example, lower metal gate layer 412 of first AOS channel 402 may be mounted on insulating layer 208 of FEOL portion 202, and gate module 306 may be above and in contact with upper metal gate layer 410 of second AOS channel 414, or an uppermost AOS channel 308. Non-planar transistor 212 may include second AOS channel 414 mounted on first AOS channel 402, however, it will be appreciated that more than two AOS channels 308 may be incorporated in non-planar transistor 212. More particularly, incorporating more AOS channels 308 may increase the electrical current flowing through non-planar transistor 212, and thus, may improve a signal transmission through non-planar transistor 212.

In an embodiment, the stacked AOS channels 308 may share a layer. For example, upper metal gate layer 410 of first AOS channel 402 may be a same structure as lower metal gate layer 412 of second AOS channel 414, as shown in FIG. 4A. That is, an upper metal gate layer 410 of one AOS channel 308 may be the lower metal gate layer 412 of another AOS channel 308. Given that AOS channels 308 may share metal gates, and the metal gates may be in contact with gate module 306, the AOS channels 308 may be subject to a same drive voltage applied by gate module 306. Accordingly, the AOS channels 308 of non-planar transistor 212 may act together as a single transistor channel.

The conductive structures of non-planar transistor 212 may be insulated from each other to prevent electrical shorting. For example, as described above, the dielectric layers 214 of the electrical conduit may separate AOS layer 404 from upper metal gate layer 410 or lower metal gate layer 412 to prevent electrical shorting between those components. An internal spacer 420 may be disposed laterally between the metal gate layers in the stack of AOS channels 308 and source module 302 to prevent electrical shorting between those components. Similarly, internal spacer 420 may be disposed laterally between metal gate layers in the stack of AOS channels 308 and drain module 304 to prevent electrical shorting between those components. Like internal spacers 420, an external spacer 422 may surround gate module 306 to prevent electrical shorting between gate module 306 and a surrounding structure, e.g., conductive structures within BEOL portion 204 of integrated circuit die 102.

Referring to FIG. 4B, a sectional view, taken about line A-A of FIG. 3, of a non-planar transistor in a back-end-of-line portion of an integrated circuit die is shown in accordance with an embodiment. The cross-sectional view may be orthogonal to the gate cut view of FIG. 4A and may be referred to as a fin cut view. The fin cut view illustrates the fin-like three-dimensional structure of non-planar transistor 212. More particularly, a width of non-planar transistor 212 may be less than a height of non-planar transistor 212. AOS layer 404 of AOS channel 308 may also be fin-like, but with an opposite aspect ratio of the overall transistor structure. For example, AOS channel 308 and AOS layer 404 may have a transverse width 424 between laterally separated transverse edges 426 of AOS channel 308. Thickness 428 may be in a range of 2-50 nm, e.g., 5 nm, and transverse width 424 may be in a range of 20-100 nm. Accordingly, transverse width 424 may be at least twice a thickness 428, e.g., a transverse width 424 to thickness 428 ratio may be in a range of 2 to 5.

Gate module 306 may extend around AOS channel 308 and/or the stack of AOS channels 308 along the transverse cross-sectional plane. More particularly, gate module 306 may extend transversely around AOS channel 308 at an axial location between source module 302 and drain module 304. The path of gate module 306 around the AOS channel(s) 308 may include a U-shape 430 around AOS channel 308. For example, the cross-sectional area of gate module 306 may be in the shape of an inverted U, having vertical legs 432 on either side of the stack of AOS channels 308. Each vertical leg 432 may extend upward from insulating layer 208, or another base structure, to a horizontal connector 434 of gate module 306. Furthermore, horizontal connector 434 may extend horizontally or laterally between vertical legs 432. Thus, gate module 306 may surround the stack of AOS channels 308 to apply the drive voltage along several faces of the AOS channels 308 to create a chokehold on the electrical current of non-planar transistor 212.

In an embodiment, the conductive material of gate module 306 may be physically distinct from the conductive material of the metal gate layers, e.g., upper metal gate layer 410 and lower metal gate layer 412. For example, as described below, gate module 306 may be formed during a different BEOL process operation than a BEOL process operation used to form upper metal gate layer 410 or lower metal gate layer 412. As such, a physical separation may exist between gate module 306 and the metal gate layers. By way of example, gate module 306 may include a conductive material having a different composition or phase than the conductive material of the metal gate layers. That is, gate module 306 is optionally formed from a different material than the metal gate layers of AOS channel(s) 308. By way of example, the metal gate layers may include one or more of deposited copper, nickel nitride, or tungsten, and gate module 306 may include a different one of deposited copper, nickel nitride, or tungsten. Accordingly, the structures may be metallurgically distinct even when the structures are physically in contact. In an embodiment, a transverse gap (not shown) may separate transverse edges 426 of AOS channel 308 from vertical legs 432. More particularly, a separation distance, e.g., a void, a barrier layer, etc., may be disposed between transverse edge 426 of upper metal gate layer 410 or lower metal gate layer 412, and an adjacent vertical leg 432 of gate module 306.

Figure 5:
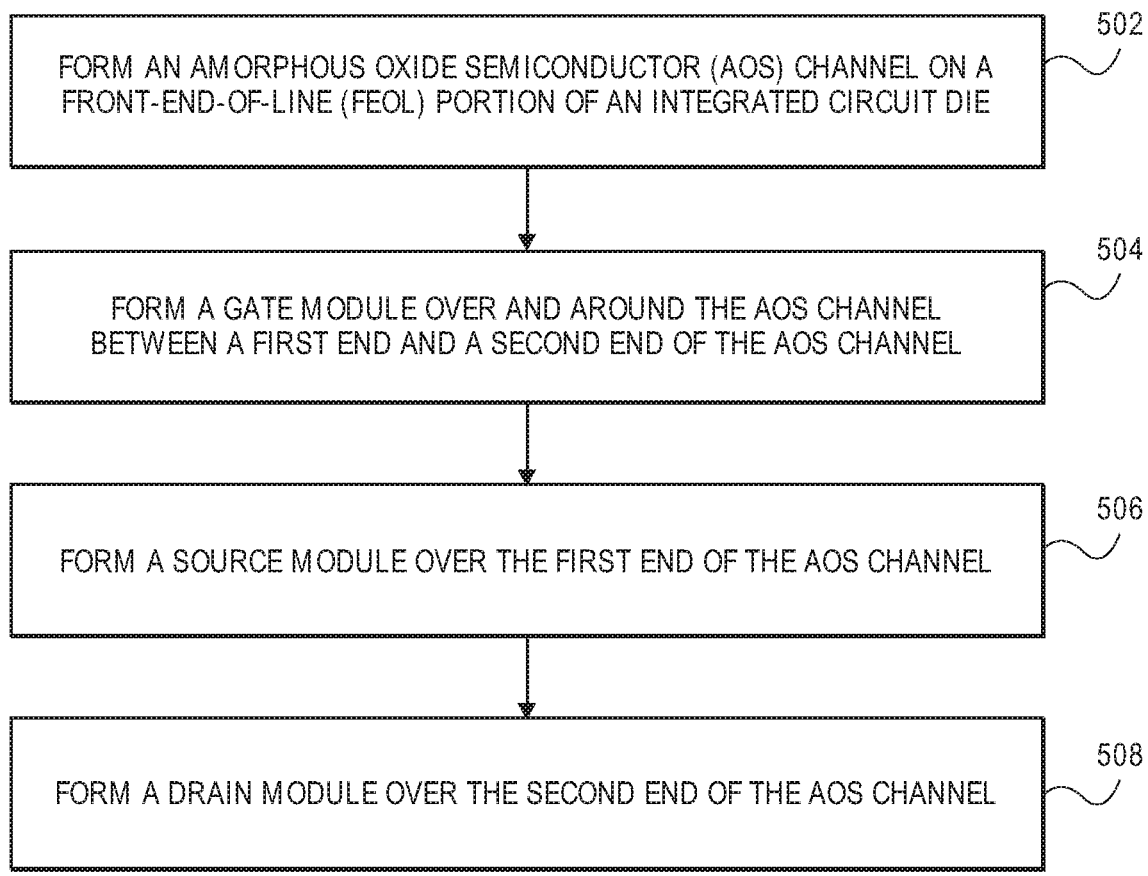
FIG. 5 illustrates a method of fabricating a non-planar transistor in a back-end-of-line portion of an integrated circuit die, in accordance with an embodiment.

Referring to FIG. 5, a method of fabricating a non-planar transistor in a back-end-of-line portion of an integrated circuit die is shown in accordance with an embodiment. FIGS. 6-11B illustrate operations of the method, and thus, are described in tandem with FIG. 5 below.

Figure 6:
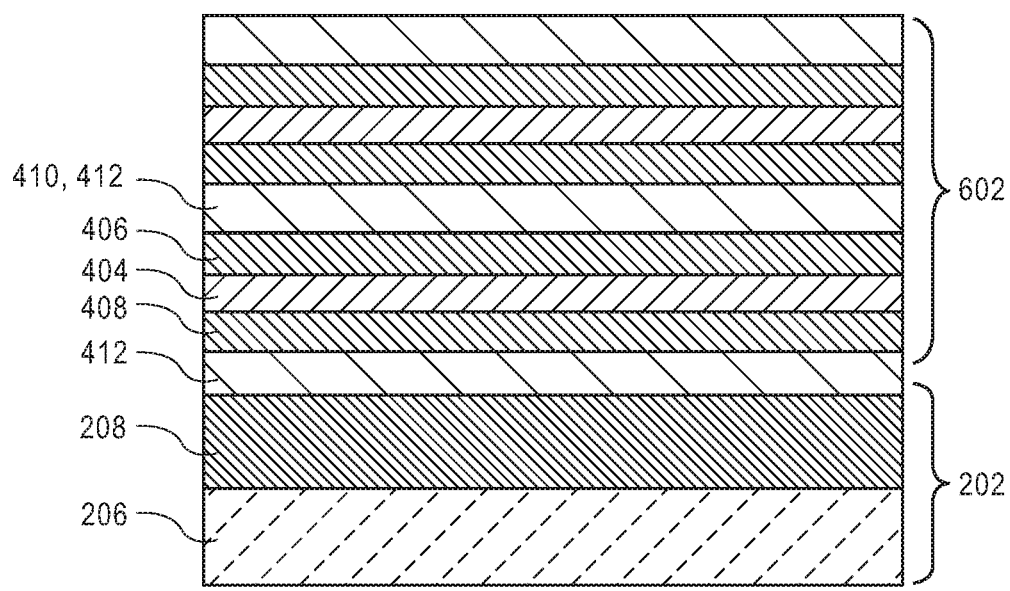

At operation 502, AOS channel 308 may be formed on FEOL portion 202 of integrated circuit die 102. Referring to FIG. 6, a stack deposition operation of a method of fabricating a non-planar transistor in a back-end-of-line portion of an integrated circuit die is shown in accordance with an embodiment. A back end transistor may be formed in a BEOL process after front end transistors are formed in an FEOL process. More particularly, a starting stack 602 of material layers may be deposited over FEOL portion 202, i.e., over the planar transistors 210 of FEOL portion 202. For example, FEOL portion 202 may have an upper surface extending laterally across a width and length of integrated circuit die 102, and a layer of metal may be deposited over the upper surface to form a predecessor structure to lower metal gate layer 412. Other predecessor structures of non-planar transistor 212 may be sequentially deposited or otherwise laminated on an underlying layer. For example, forming AOS channel 308 may include sequentially depositing the predecessor structures of lower metal gate layer 412, lower dielectric layer 408, AOS layer 404, upper dielectric layer 406, and upper metal gate layer 410. The sequential stack may be formed on the bottom metallic layer 412, which may in turn be formed on the insulating layer 208 of FEOL portion 202. Deposition of the stack layers may include depositing the materials described above, in the structural relationships described above. For example, the deposited AOS layer 404 in starting stack 602 may include depositing IGZO on lower dielectric layer 408.

Starting stack 602 may also include several AOS channels 308 as described above. For example, forming AOS channel 308 may include depositing second AOS channel 414 on first AOS channel 402, as illustrated in FIG. 4A. accordingly, upper metal gate layer 410 of first AOS channel 402 may be lower metal gate layer 412 of second AOS channel 414, within starting stack 602.

It is notable that, in an embodiment of the method of forming non-planar transistors 212, at least a portion of the gate structure used to control electrical current flow through AOS channel 308 is formed at a beginning of the process. More particularly, the metallic layers of starting stack 602, which eventually become upper metal gate layer 410 and lower metal gate layer 412 of respective AOS channels 308, may be deposited during the initial formation of starting stack 602 rather than by backfilling a sacrificial layer after other portions of non-planar transistor 212 are formed. This particular process flow is allowed because starting stack 602 is formed in a BEOL process having a low temperature budget. That is, formation of starting stack 602 having AOS layers 404 may not require implant anneals or source/drain regrowth, and thus, starting stack 602 including metallic layers may be formed at a lower temperature than is used by typical FEOL processes for forming planar transistors 210.

Starting stack 602 may include AOS channel layers having predetermined dimensions. For example, upper dielectric layer 406 or lower dielectric layer 408 may be formed to have a thickness in a range of 0.5-5 nm, e.g., 1 nm. Upper metal gate layer 410 or lower metal gate layer 412 may be formed to have a thickness in a range of 10-20 nm, e.g., 15 nm. A thickness of AOS layer 404 may be in a range of 2-10 nm, e.g., 5 nm. These dimensional ranges are provided by way of example only, and may be any predetermined dimension.

Referring to FIGS. 7A-7B, an etching operation of a method of fabricating a non-planar transistor in a back-end-of-line portion of an integrated circuit die is shown in accordance with an embodiment. Starting stack 602 may be patterned to form several fins 702 over the top surface of FEOL portion 202. Fins 702 may be predecessor structures to AOS layers 308. For example, starting stack 602 may be etched to form gaps between adjacent columnar structures. Fin 702 may have a fin length 704 between a first fin edge 706 and a second fin edge 706 separated in axial direction 314. By way of comparison, fin length 704 shown in FIG. 7A may be greater than a fin height 708, and fin 702 shown in the fin cut of FIG. 7B may have a fin height 708 that is greater than a fin width 710. Accordingly, fin 702 includes a columnar structure that is fin-like. The gaps between adjacent fins 702 may be sufficiently large to allow for subsequent layers to be deposited over fin 702, and sufficiently small to increase a density of non-planar transistors 212 in each layer of BEOL portion 204. In an embodiment, each fin 702 may be separated from an adjacent fin 702 by at least 50 nm, e.g., by a gap distance in a range of 60-80 nm.

Referring to FIGS. 8A-8B, a metal gate deposition and patterning operation of a method of fabricating a non-planar transistor in a back-end-of-line portion of an integrated circuit die is shown in accordance with an embodiment. At operation 504, gate module 306 may be formed over and around the patterned AOS channel 308. More particularly, gate module 306 may be formed between a first end 316 and a second end 318 of AOS channel 308, i.e., between the axially separates ends of the electrical conduit structures of AOS channels 308. As such, gate module 306 may be patterned over fin 702. For example, metal may be deposited over and around metal fin 702 and a portion of the metal may then be removed to form gate module 306 having U-shape shape 430 around fin 702. As shown in FIG. 8, a gate module length 802 of gate module 306 may be less than fin length 704 such that axial edges of the AOS channel stack extend laterally beyond lateral edges of gate module 306. Accordingly, the AOS channel stack having AOS channels 308 may extend through a surrounding gate module 306 structure.

Figure 9A:
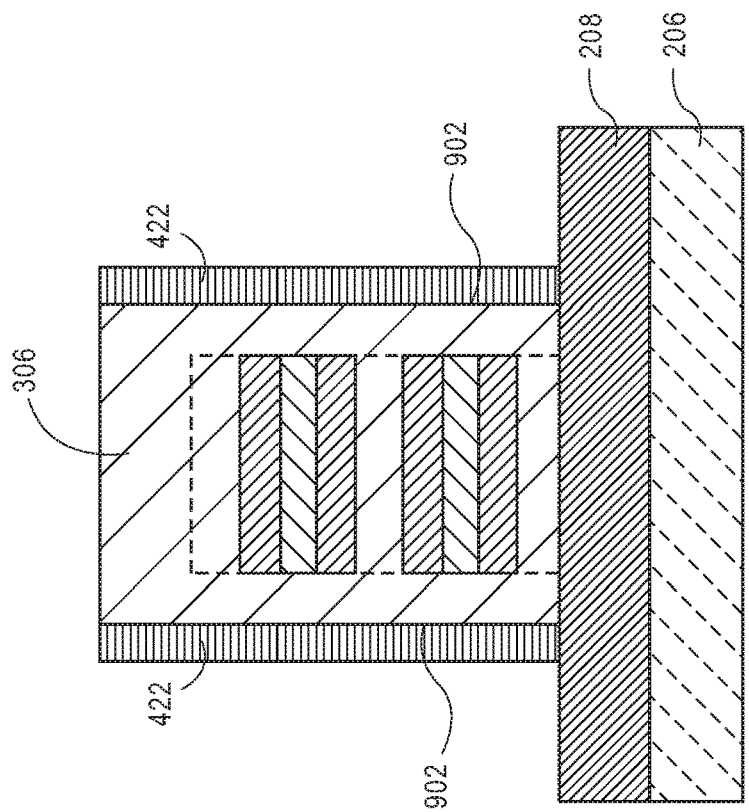
Figure 9B:
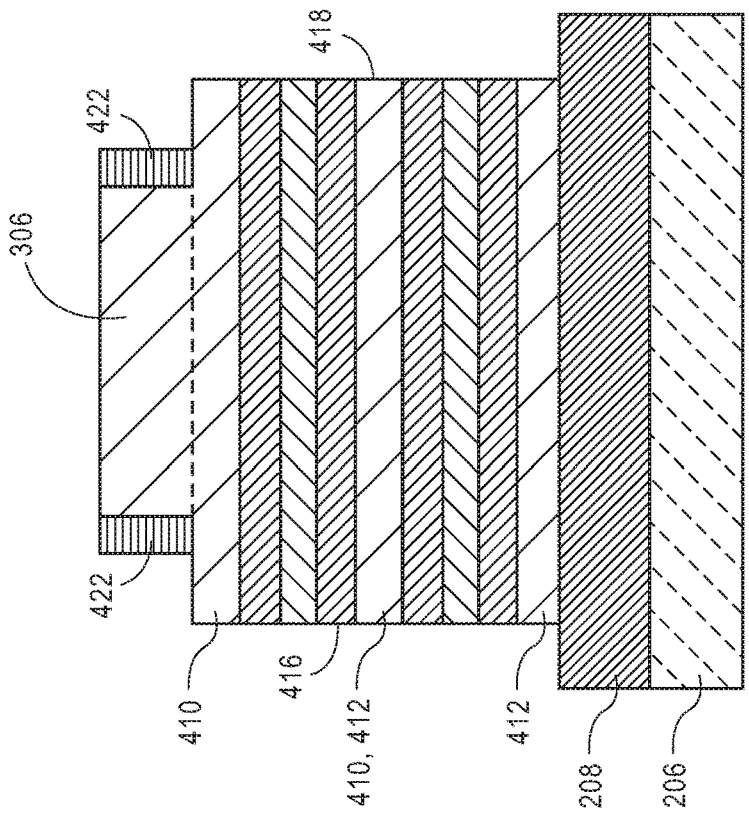

Referring to FIGS. 9A-9B, a spacer patterning operation of a method of fabricating a non-planar transistor in a back-end-of-line portion of an integrated circuit die is shown in accordance with an embodiment. Prior to forming source module 302 and drain module 304, spacers may be deposited and patterned to prevent electrical shorting between the previously built metallic portions, e.g., metal gate layers 410, 412 and gate module 306, and the to-be-formed conductors, e.g., source module 302 and drain module 304. In an embodiment, external spacer 422 may be deposited as a layer covering and surrounding the previously built AOS channel 308. Subsequently, external spacer 422 material may be selectively etched to remove the dielectric material from the a top surface of gate module 306 and first end 316 and second end 318 surfaces of the stacked AOS channels 308. More particularly, external spacer 422 may be removed from the regions at which source module 302 and drain module 304 are to be formed. Accordingly, external spacer 422 may be located over the sidewalls 902 of gate module 306, however, first end 316 and second end 318 may extend laterally outward from external spacer 422.

Figure 10B:
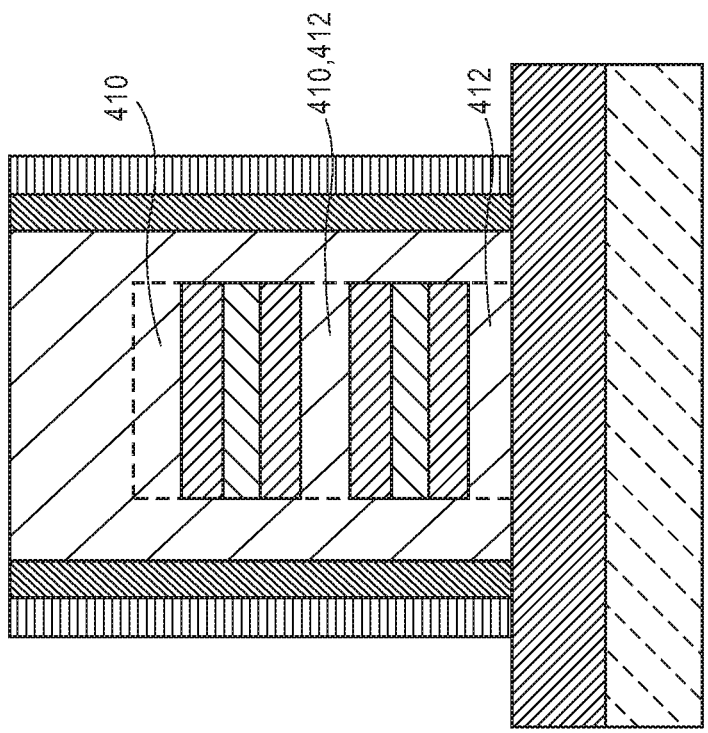
Figure 10A:
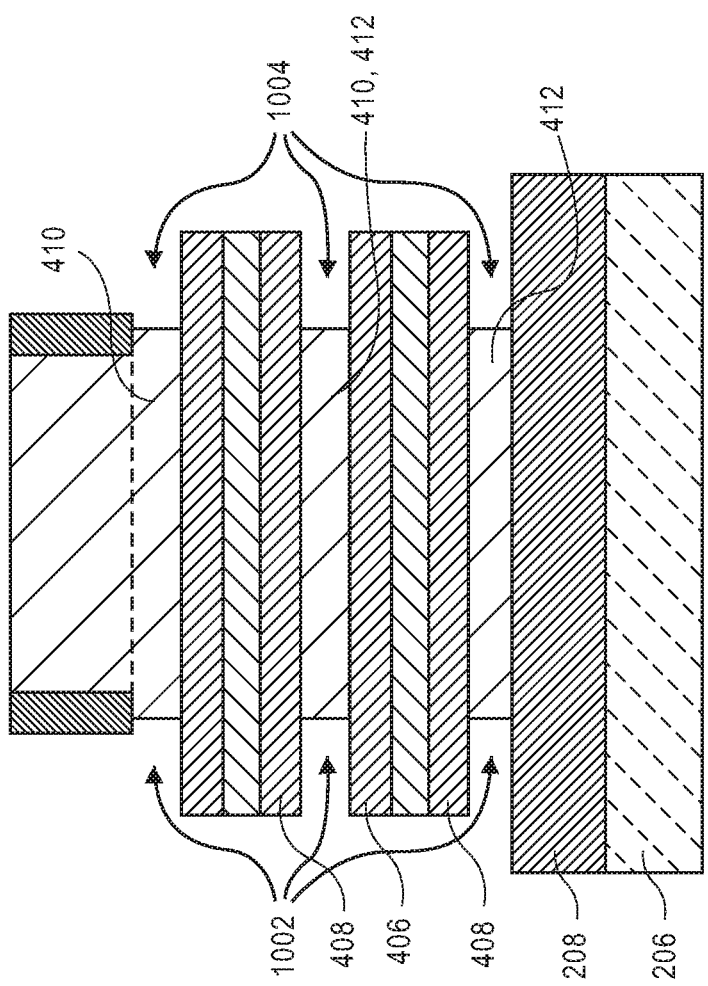

Referring to FIGS. 10A-10B, a selective removal operation of a method of fabricating a non-planar transistor in a back-end-of-line portion of an integrated circuit die is shown in accordance with an embodiment. Selective removal of metal gate layers 410, 412 vertically between adjacent electrical conduits of AOS channels 308 may be performed to form openings for source module 302 and drain module 304. The metal material may be removed using a wet etch process to selectively etch through metal gate layers underneath the dielectric layers 406, 408 of the AOS channels 308. Removal of the metal gate material may prevent the metal gate layers from acting as a dead short between drain module 304 and source module 302. As shown in the gate cut of FIG. 10A, removal of the metallic layers between adjacent dielectric layers 406, 408 in the AOS channel 308 stack may form undercuts 1004 between the dielectric layers. For example, undercut 1004 may be located vertically between the top surface of insulating layer 208 of FEOL portion 202 and a bottom surface of lower dielectric layer 408 of the bottom AOS channel 308. Similarly, undercut 1004 may be vertically located between a top surface of upper dielectric layer 406 of the bottom AOS channel 308 and a bottom surface of lower dielectric layer 408 of the top AOS channel 308. Undercuts 1004 may also extend slightly below external spacer 422. As shown in the fin cut of FIG. 10B, removal of material to form undercuts 1004 may be selective in that metal is removed in an axial direction 314 and not in a transverse direction. More particularly, the fin cut of FIG. 9B prior to material removal may be identical to the fin cut of FIG. 10B after material removal, i.e., there may be no evident undercuts 1004 in metal gate layers 410, 412 in the cross-section.

Figure 11B:
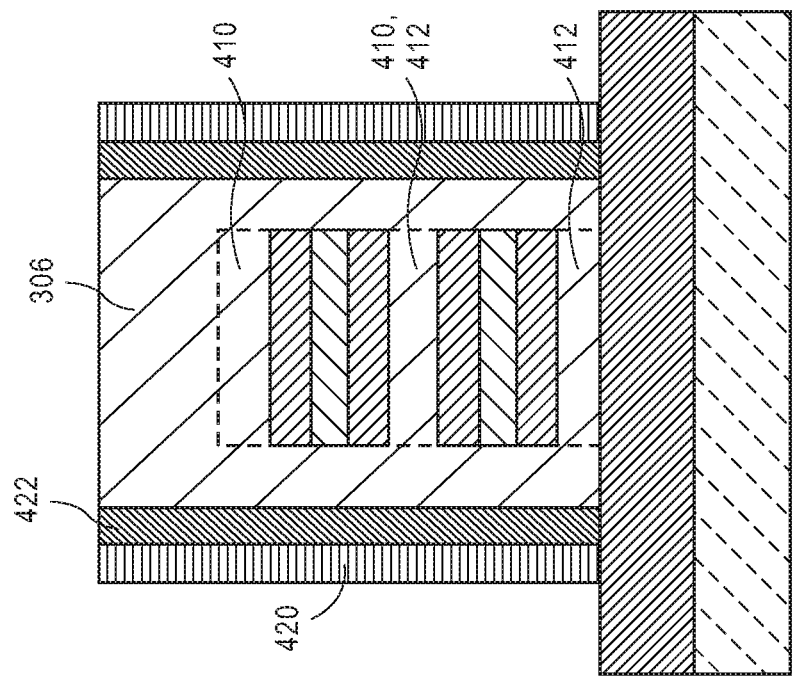
Figure 11A:
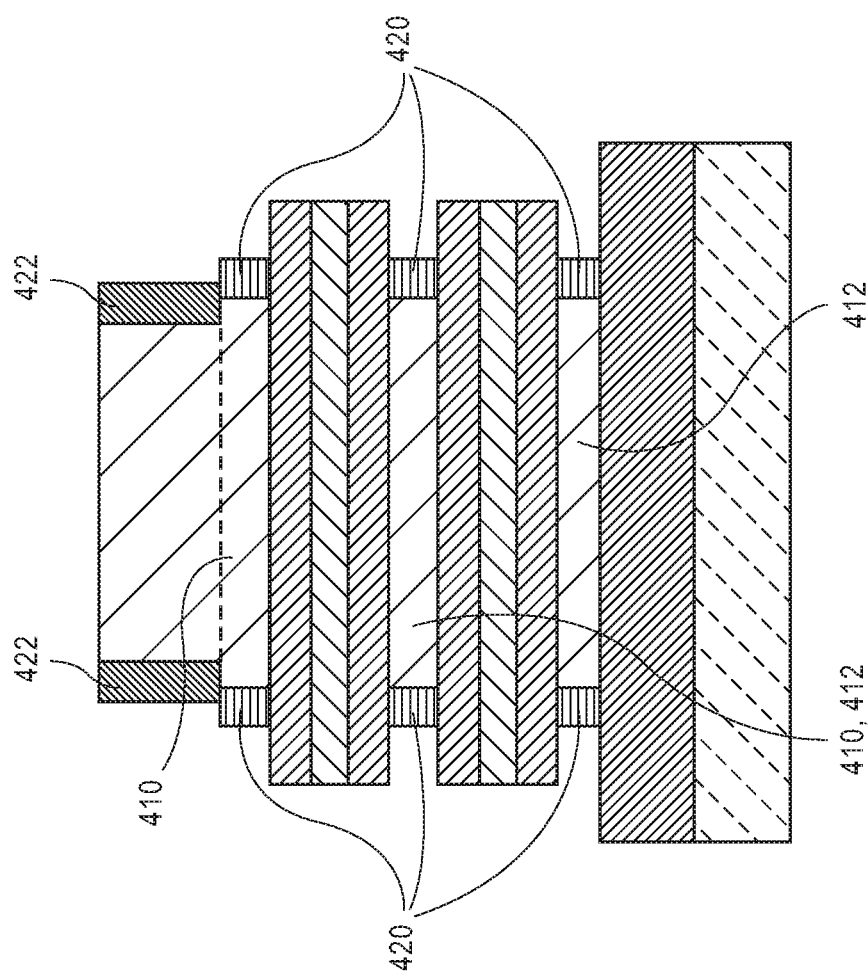

Referring to FIG. 11A-11B, an internal spacer patterning operation of a method of fabricating a non-planar transistor in a back-end-of-line portion of an integrated circuit die is shown in accordance with an embodiment. Internal spacer 420 may be deposited into the undercuts 1004 described above. More particularly, as shown in the gate cut of FIG. 11A, internal spacers 420 may surround the previously built structure and conform to the recessed surfaces of the metal gate layers 410, 412. Thus, internal spacers 420 may be disposed between FEOL portion 202 and a dielectric layer of an AOS channel 308, between dielectric layers of adjacent AOS channels 308, or between a dielectric layer of an AOS channel 308 and external spacer 422. Internal spacer 420 material may be directionally etched to remove the deposited material to form a predetermined structure. As shown in the fin cut of FIG. 11B, internal spacer 420 may laterally surround external spacer 422. Accordingly, the metal gate structures, i.e., the metal gate layers 410, 412 and gate module 306, of non-planar transistor 212 may be laterally surrounded by a dielectric material of external spacer 422 and internal spacer 420. Thus, electrical shorting between the metal gate structures and other structures of non-planar transistor 212 or BEOL portion 204, may be prevented. It is noted that the dielectric materials of internal spacer 420 and external spacer 422 may be different materials. For example, the dielectric materials of each may be chosen based on a desired dielectric constant or suitability for an intended fabrication process.

Referring again to FIGS. 4A-4B, at operation 506, source module 302 may be formed over a first end 316 of the AOS channel 308. More particularly, a conductive material forming source module 302 may be deposited to wrap around the first axial end 316 of the electrical conduits of AOS channels 308. Source module 302 may fill within the remaining undercuts 1004 between the dielectric layers of adjacent AOS channels 308. Accordingly, source module 302 may be electrically connected to the AOS channels 308 to direct electrical current into the AOS channels 308 when the gate module 306 is turned on.

At operation 508, drain module 304 may be formed over a second end 318 of AOS channel 308. More particularly, a conductive material forming drain module 304 may be deposited to wrap around the second axial end 318 of the electrical conduits of AOS channels 308. Drain module 304 may fill within the remaining undercuts 1004 between the dielectric layers 214 of adjacent AOS channels 308. Accordingly, drain module 304 may be electrically connected to the AOS channels 308 to receive electrical current from the AOS channels 308 when the gate module 306 is turned on. Thus, when the non-planar transistor 212 is fully formed as shown in FIGS. 4A-4B, electrical current may be applied at source module 302 and may flow through AOS channels 308 into drain module 304 depending on whether a sufficient drive voltage is applied to activate gate module 306.

Each of the process operations of the method of fabricating a non-planar transistor 212 may be performed as a BEOL process. More particularly, forming AOS channel 308, gate module 306, source module 302, and drain module 304, may be BEOL processes having thermal budgets less than a typical FEOL process. For example, a thermal budget of one or more of the fabrication operations may be less than 500° C., e.g., 400° C. Accordingly, non-planar transistor 212 may be built into a layer of BEOL portion 204 of integrated circuit die 102. Accordingly, non-planar transistor 212 may be embedded inside of dielectric layers 214 of BEOL portion 204. More particularly, dielectric layers 214 of BEOL portion 204 may be formed over and around non-planar transistor 212. Furthermore, non-planar transistors 212 may be fabricated in a same or different layer of BEOL portion 204. Thus, non-planar transistors 212 in a first layer of BEOL portion 204 may be stacked over or under non-planar transistor 212 and a second layer of BEOL portion 204. As such, a number of total transistors, i.e., planar transistors 210 and FEOL portion 202 and non-planar transistors 212 in BEOL portion 204, as well as a density of transistors, may be increased in integrated circuit die 102.

Figure 12:
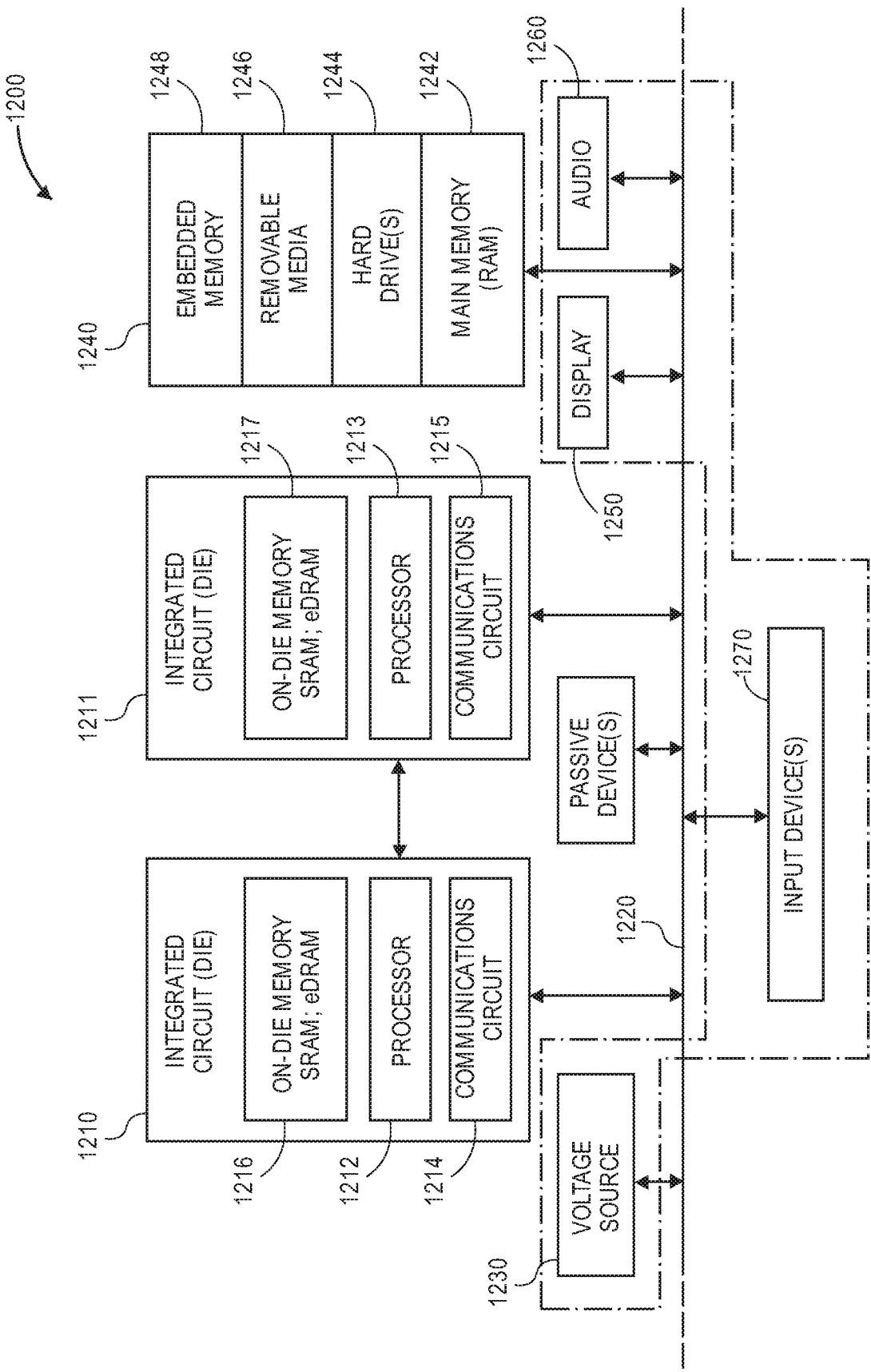
FIG. 12 is a schematic of a computer system, in accordance with an embodiment.

FIG. 12 is a schematic of a computer system, in accordance with an embodiment. The computer system 1200 (also referred to as the electronic system 1200) as depicted can embody a semiconductor package including an integrated circuit die having multi-gate, non-planar transistors built into a back-end-of-line portion of the die, according to any of the several disclosed embodiments and their equivalents as set forth in this disclosure. The computer system 1200 may be a mobile device such as a netbook computer. The computer system 1200 may be a mobile device such as a wireless smart phone. The computer system 1200 may be a desktop computer. The computer system 1200 may be a hand-held reader. The computer system 1200 may be a server system. The computer system 1200 may be a supercomputer or high-performance computing system.

In an embodiment, the electronic system 1200 is a computer system that includes a system bus 1220 to electrically couple the various components of the electronic system 1200. The system bus 1220 is a single bus or any combination of busses according to various embodiments. The electronic system 1200 includes a voltage source 1230 that provides power to the integrated circuit 1210. In some embodiments, the voltage source 1230 supplies current to the integrated circuit 1210 through the system bus 1220.

The integrated circuit 1210 is electrically coupled to the system bus 1220 and includes any circuit, or combination of circuits according to an embodiment. In an embodiment, the integrated circuit 1210 includes a processor 1212 that can be of any type. As used herein, the processor 1212 may mean any type of circuit such as, but not limited to, a microprocessor, a microcontroller, a graphics processor, a digital signal processor, or another processor. In an embodiment, the processor 1212 includes, or is coupled with, a semiconductor package including an integrated circuit die having multi-gate, non-planar transistors built into a back-end-of-line portion of the die, as disclosed herein. In an embodiment, SRAM embodiments are found in memory caches of the processor. Other types of circuits that can be included in the integrated circuit 1210 are a custom circuit or an application-specific integrated circuit (ASIC), such as a communications circuit 1214 for use in wireless devices such as cellular telephones, smart phones, pagers, portable computers, two-way radios, and similar electronic systems, or a communications circuit for servers. In an embodiment, the integrated circuit 1210 includes on-die memory 1216 such as static random-access memory (SRAM). In an embodiment, the integrated circuit 1210 includes embedded on-die memory 1216 such as embedded dynamic random-access memory (eDRAM).

In an embodiment, the integrated circuit 1210 is complemented with a subsequent integrated circuit 1211. Useful embodiments include a dual processor 1213 and a dual communications circuit 1215 and dual on-die memory 1217 such as SRAM. In an embodiment, the dual integrated circuit 1211 includes embedded on-die memory 1217 such as eDRAM.

In an embodiment, the electronic system 1200 also includes an external memory 1240 that in turn may include one or more memory elements suitable to the particular application, such as a main memory 1242 in the form of RAM, one or more hard drives 1244, and/or one or more drives that handle removable media 1246, such as diskettes, compact disks (CDs), digital variable disks (DVDs), flash memory drives, and other removable media known in the art. The external memory 1240 may also be embedded memory 1248 such as the first die in a die stack, according to an embodiment.

In an embodiment, the electronic system 1200 also includes a display device 1250, and an audio output 1260. In an embodiment, the electronic system 1200 includes an input device such as a controller 1270 that may be a keyboard, mouse, trackball, game controller, microphone, voice-recognition device, or any other input device that inputs information into the electronic system 1200. In an embodiment, an input device 1270 is a camera. In an embodiment, an input device 1270 is a digital sound recorder. In an embodiment, an input device 1270 is a camera and a digital sound recorder.

As shown herein, the integrated circuit 1210 can be implemented in a number of different embodiments, including a semiconductor package having an integrated circuit die including multi-gate, non-planar transistors built into a back-end-of-line portion of the die, according to any of the several disclosed embodiments and their equivalents, an electronic system, a computer system, one or more methods of fabricating an integrated circuit, and one or more methods of fabricating an electronic assembly that includes a semiconductor package including an integrated circuit die having multi-gate, non-planar transistors built into a back-end-of-line portion of the die, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a semiconductor package including an integrated circuit die having multi-gate, non-planar transistors built into a back-end-of-line portion of the die embodiments and their equivalents. A foundation substrate may be included, as represented by the dashed line of FIG. 12. Passive devices may also be included, as is also depicted in FIG. 12.

Embodiments of an integrated circuit die having multi-gate, non-planar transistors built into a back-end-of-line portion of the die are described above. In an embodiment, an integrated circuit die includes a front-end-of-line (FEOL) portion. The FEOL portion includes a silicon layer having several transistors, and an insulating layer over the silicon layer. The integrated circuit dies includes a back-end-of-line (BEOL) portion mounted on the insulating layer. The BEOL portion includes a non-planar transistor. The non-planar transistor includes an amorphous oxide semiconductor (AOS) channel extending axially from a first end to a second end, and a gate module extending transversely around the AOS channel at an axial location between a source module at the first end and a drain module at the second end.

In one embodiment, the AOS channel includes an AOS layer between an upper dielectric layer and a lower dielectric layer. The upper dielectric layer is between an upper metal gate layer and the AOS layer. The lower dielectric layer is between a lower metal gate layer and the AOS layer.

In one embodiment, the AOS layer includes indium gallium zinc oxide.

In one embodiment, the gate module has a U-shape around the AOS channel

In one embodiment, the AOS channel has a transverse width between respective transverse edges, and the transverse width is at least twice a thickness of the AOS layer.

In one embodiment, the U-shape includes vertical legs separated from the transverse edges of the AOS channel by a transverse gap.

In one embodiment, the metal gate layers extend axially between a first axial edge and a second axial edge. The first axial edge is axially between the source module and the gate module, and the second axial edge is axially between the gate module and the drain module.

In one embodiment, the non-planar transistor includes a stack of AOS channels including the AOS channel and a second AOS channel The AOS channel is mounted on the FEOL portion and the second AOS channel is mounted on the AOS channel The upper metal gate layer of the AOS channel is a lower metal gate layer of the second AOS channel In one embodiment, the BEOL portion includes a dielectric layer laterally surrounding the non-planar transistor.

In an embodiment, an integrated circuit package includes a package substrate. The integrated circuit package includes an integrated circuit die mounted on the package substrate. The integrated circuit die includes a front-end-of-line (FEOL) portion including a silicon layer having several transistors, and an insulating layer over the silicon layer. The integrated circuit die includes a back-end-of-line (BEOL) portion mounted on the insulating layer. The BEOL portion includes a non-planar transistor having a stack of amorphous oxide semiconductor (AOS) channels extending axially from a first end to a second end, and a gate module extending transversely around the stack of AOS channels at an axial location between a source module at the first end and a drain module at the second end.

In one embodiment, the stack of AOS channels includes several AOS layers between respective upper dielectric layers and lower dielectric layers. The respective upper dielectric layers are between respective upper metal gate layers and the respective AOS layer. The respective lower dielectric layer is between a respective lower metal gate layer and the respective AOS layer.

In one embodiment, the several AOS layers include indium gallium zinc oxide.

In one embodiment, the gate module has a U-shape around the stack of AOS channels.

In one embodiment, the stack of AOS channels includes a first AOS channel and a second AOS channel The first AOS channel is mounted on the FEOL portion and the second AOS channel is mounted on the AOS channel. A respective upper metal gate layer of the first AOS channel is a respective lower metal gate layer of the second AOS channel In one embodiment, the BEOL portion includes a dielectric layer laterally surrounding the non-planar transistor.

In an embodiment, a method of fabricating a non-planar transistor in a back-end-of-line portion of an integrated circuit die includes forming an amorphous oxide semiconductor (AOS) channel on a front-end-of-line (FEOL) portion of an integrated circuit die having several transistors. The AOS channel extends axially from a first end to a second end. The method includes forming a gate module over the AOS channel The gate module extends around the AOS channel axially between the first end and the second end. The method includes forming a source module over the first end of the AOS channel. The method includes forming a drain module over the second end of the AOS channel.

In one embodiment, forming the AOS channel includes sequentially depositing a lower metal gate layer, a lower dielectric layer, an AOS layer, an upper dielectric layer, and an upper metal gate layer on an insulating layer of the FEOL portion.

In one embodiment, depositing the AOS layer includes depositing indium gallium zinc oxide on the lower dielectric layer.

In one embodiment, forming the AOS channel includes depositing a second AOS channel on the AOS channel The upper metal gate layer of the AOS channel is a lower metal gate layer of the second AOS channel.

In one embodiment, forming the AOS channel, the gate module, the source module, and the drain module are back-end-of-line processes having thermal budgets less than 500° C.

What is claimed is:

1. An integrated circuit die, comprising:
    a front-end-of-line (FEOL) portion including a silicon layer having a plurality of transistors, and an insulating layer over the silicon layer; and
    a back-end-of-line (BEOL) portion mounted on the insulating layer, the BEOL portion including a non-planar transistor having
        an amorphous oxide semiconductor (AOS) channel extending axially from a first end to a second end, and
        a gate module extending transversely around the AOS channel at an axial location between a source module at the first end and a drain module at the second end, wherein the AOS channel includes an AOS layer between an upper dielectric layer and a lower dielectric layer, and wherein the upper dielectric layer is between an upper metal gate layer and the AOS layer, and the lower dielectric layer is between a lower metal gate layer and the AOS layer.

2. The integrated circuit die of claim 1, wherein the AOS layer includes indium gallium zinc oxide.

3. The integrated circuit die of claim 2, wherein the gate module has a U-shape around the AOS channel.

4. The integrated circuit die of claim 3, wherein the AOS channel has a transverse width between respective transverse edges, and wherein the transverse width is at least twice a thickness of the AOS layer.

5. The integrated circuit die of claim 4, wherein the U-shape includes vertical legs separated from the transverse edges of the AOS channel by a transverse gap.

6. The integrated circuit die of claim 2, wherein the metal gate layers extend axially between a first axial edge and a second axial edge, wherein the first axial edge is axially between the source module and the gate module, and wherein the second axial edge is axially between the gate module and the drain module.

7. The integrated circuit die of claim 2, wherein the non-planar transistor includes a stack of AOS channels including the AOS channel and a second AOS channel, wherein the AOS channel is mounted on the FEOL portion and the second AOS channel is mounted on the AOS channel, and wherein the upper metal gate layer of the AOS channel is a lower metal gate layer of the second AOS channel.

8. The integrated circuit die of claim 7, wherein the BEOL portion includes a dielectric layer laterally surrounding the non-planar transistor.

9. An integrated circuit package, comprising:
    a package substrate; and
    an integrated circuit die mounted on the package substrate, wherein the integrated circuit die includes
    a front-end-of-line (FEOL) portion including a silicon layer having a plurality of transistors, and an insulating layer over the silicon layer, and
    a back-end-of-line (BEOL) portion mounted on the insulating layer, the BEOL portion including a non-planar transistor having
        a stack of amorphous oxide semiconductor (AOS) channels extending axially from a first end to a second end, and
        a gate module extending transversely around the stack of AOS channels at an axial location between a source module at the first end and a drain module at the second end, wherein the stack of AOS channels includes a plurality of AOS layers between respective upper dielectric layers and lower dielectric layers, and wherein the respective upper dielectric layers are between respective upper metal gate layers and the respective AOS layer, and the respective lower dielectric layer is between a respective lower metal gate layer and the respective AOS layer.

10. The integrated circuit package of claim 9, wherein the plurality of AOS layers include indium gallium zinc oxide.

11. The integrated circuit package of claim 10, wherein the gate module has a U-shape around the stack of AOS channels.

12. The integrated circuit package of claim 10, wherein the stack of AOS channels includes a first AOS channel and a second AOS channel, wherein the first AOS channel is mounted on the FEOL portion and the second AOS channel is mounted on the AOS channel, and wherein a respective upper metal gate layer of the first AOS channel is a respective lower metal gate layer of the second AOS channel.

13. The integrated circuit package of claim 12, wherein the BEOL portion includes a dielectric layer laterally surrounding the non-planar transistor.

14. A method, comprising:
  forming an amorphous oxide semiconductor (AOS) channel on a front-end-of-line (FEOL) portion of an integrated circuit die having a plurality of transistors, wherein the AOS channel extends axially from a first end to a second end;
  forming a gate module over the AOS channel, wherein the gate module extends around the AOS channel axially between the first end and the second end;
  forming a source module over the first end of the AOS channel; and
  forming a drain module over the second end of the AOS channel, wherein forming the AOS channel includes sequentially depositing a lower metal gate layer, a lower dielectric layer, an AOS layer, an upper dielectric layer, and an upper metal gate layer on an insulating layer of the FEOL portion.

15. The method of claim 14, wherein depositing the AOS layer includes depositing indium gallium zinc oxide on the lower dielectric layer.

16. The method of claim 15, wherein forming the AOS channel includes depositing a second AOS channel on the AOS channel, wherein the upper metal gate layer of the AOS channel is a lower metal gate layer of the second AOS channel.

17. The method of claim 16, wherein forming the AOS channel, the gate module, the source module, and the drain module are back-end-of-line processes having thermal budgets less than 500° C.

\* \* \* \* \*